United States Patent
Hazeltine

(10) Patent No.: US 10,525,430 B2
(45) Date of Patent: Jan. 7, 2020

(54) DRAFT TUBE FLUIDIZED BED REACTOR FOR DEPOSITION OF GRANULAR SILICON

(71) Applicant: Bruce Hazeltine, Missoula, MT (US)

(72) Inventor: Bruce Hazeltine, Missoula, MT (US)

(*) Notice: Subject to any disclaimer, the term of this patent is extended or adjusted under 35 U.S.C. 154(b) by 443 days.

(21) Appl. No.: 14/585,017

(22) Filed: Dec. 29, 2014

(65) Prior Publication Data

US 2015/0182930 A1 Jul. 2, 2015

Related U.S. Application Data

(60) Provisional application No. 61/920,945, filed on Dec. 26, 2013.

(51) Int. Cl.
| | |
|---|---|
| *B01J 8/18* | (2006.01) |
| *C01B 33/029* | (2006.01) |
| *B01J 8/34* | (2006.01) |
| *C23C 16/442* | (2006.01) |

(52) U.S. Cl.
CPC ........... *B01J 8/1827* (2013.01); *B01J 8/1854* (2013.01); *B01J 8/1872* (2013.01); *B01J 8/34* (2013.01); *C01B 33/029* (2013.01); *C23C 16/442* (2013.01)

(58) Field of Classification Search
CPC . B01J 8/1827; B01J 8/1854; B01J 8/34; B01J 8/1872; C01B 33/029
See application file for complete search history.

(56) References Cited

U.S. PATENT DOCUMENTS

| | | | |
|---|---|---|---|
| 4,786,477 A * | 11/1988 | Yoon | B01J 8/42 118/716 |
| 4,992,245 A | 2/1991 | Van Slooten et al. | |
| 5,165,908 A | 11/1992 | Van Slooten et al. | |
| 5,810,934 A | 9/1998 | Lord et al. | |
| 8,075,692 B2 | 12/2011 | Osborne et al. | |
| 8,404,206 B2 | 3/2013 | Kulkarni et al. | |
| 8,535,614 B2 | 9/2013 | Chu | |
| 2002/0183573 A1 * | 12/2002 | Cocco | B01J 23/83 585/444 |
| 2006/0105105 A1 | 5/2006 | Ibrahim et al. | |
| 2009/0324479 A1 | 12/2009 | Kulkarni et al. | |
| 2010/0068116 A1 * | 3/2010 | Kim | C01B 33/027 423/349 |
| 2011/0244124 A1 | 10/2011 | Kulkarni et al. | |
| 2013/0084234 A1 | 4/2013 | Bhusarapu et al. | |
| 2014/0174353 A1 * | 6/2014 | Spangler et al. | C23C 16/442 |

* cited by examiner

*Primary Examiner* — Jeffrie R Lund
*Assistant Examiner* — Mirza Israr Javed

(57) ABSTRACT

A granular fluidized bed reactor (FBR) for production of high purity silicon is described. The FBR uses a draft tube to promote internal circulation while minimizing voids in the fluidized bed, one significant cause of dust formation. The FBR design has geometries to minimize reactive gas concentration within the draft tube and imposes a desirable circulation pattern in operation. A portion of the FBR wall above a reactive zone provides heat input to maximize deposition on silicon beads while minimizing wall deposition. The FBR is made of carbon composite, ceramic, and graphite materials in a design to minimize contamination and enable silicon deposits to be melted out.

14 Claims, 6 Drawing Sheets

DRAFT TUBE FLUIDIZED BED REACTOR FOR DEPOSITION OF GRANULAR SILICON

CROSS-REFERENCE TO RELATED APPLICATIONS

This application claims the benefits of U.S. Provisional Application No. 61/920,945, filed Dec. 26, 2013, the disclosure of which is hereby incorporated by reference in its entirety including all figures, tables and drawings.

STATEMENT REGARDING FEDERALLY SPONSORED RESEARCH OR DEVELOPMENT

Not applicable.

REFERENCE TO SEQUENCE LISTING, A TABLE, OR A COMPUTER PROGRAM LISTING COMPACT DISC APPENDIX

Not applicable.

FIELD OF THE INVENTION

This invention relates generally to a reactor and process to make high purity granular silicon in a chemical vapor deposition (CVD) fluidized bed reactor (FBR) where that FBR contains a draft tube. The reactor is fed a silicon containing gas and preferably makes use of graphite and carbon/carbon composite materials of construction.

BACKGROUND OF THE INVENTION

Chemical vapor deposition (CVD) reactors are used to produce polycrystalline silicon (polysilicon), the key raw material used in the manufacture of most semiconductor devices and silicon-based solar wafers and cells. The most widely used method for producing polysilicon is the Siemens reactor process generally according to the primary reactions below:

$$HSiCl_3 + H_2 \rightarrow 3HCl + Si$$

$$HCl + HSiCl_3 \rightarrow SiCl_4 + H_2$$

$$\text{Net: } 4HSiCl_3 \rightarrow Si + 2H_2 + 3SiCl_4$$

In a related process, TCS is disproportionated to form silane (SiH4) and STC. The silane produced is used in many processes associated with semiconductors and other products, including making polysilicon in either a Siemens reactor or fluidized bed CVD process. The fluidized bed process makes silicon in irregular, but nominally spherical beads in diameters typically ranging up to about 2 mm diameter. Bead shaped polysilicon is equivalently referred to as granular polysilicon. The general chemistry of these reactions is as follows:

$$4HSiCl_3 \rightarrow SiH_4 + 3SiCl_4$$

$$SiH_4 \rightarrow Si + 2H_2$$

There is substantial patent literature regarding the CVD FBR process to make polysilicon. Lord et al., U.S. Pat. No. 5,810,934, SILICON DEPOSITION REACTOR APPARATUS provides a succinct background and numerous secondary references. Publications U.S. 2006/0105105 A1, U.S. 2009/0324479 A1, U.S. 2010/0068116 A1, and U.S. Pat. Nos. 8,535,614 B2 and 8,075,692 B2 describe related technology, the contents of which are hereby incorporated by reference. The problems routinely encountered are: 1) Formation of dust due to homogeneous nucleation of the silicon bearing gas and subsequent loss of valuable raw material; 2) Silicon deposition on the wall and internals of the FBR reducing the volume otherwise available for reactants and ultimately forcing shutdowns and cleanouts and/or rebuilds. If the FBR is made of brittle materials such as graphite or quartz, the differential coefficient of thermal expansion (CTE) between silicon deposited on the wall and the wall itself is likely to lead to reactor damage; 3) Inability to create the scenario where the reactive gas is sufficiently cold to avoid homogeneous nucleation (dust formation) and silicon beads hot enough to make shiny polycrystalline beads as opposed to amorphous silicon and/or a dusty surface that forms at lower bead temperatures; 4) Hydrogen or other gas inclusions exist within the silicon bead after deposition. A dense bead free of $H_2$ or other gases is desired to avoid problems in downstream processing; 5) Finding suitable materials of construction for the FBR that are strong enough to resist breakage and which do not also contaminate the product is a continual challenge. For instance, metallic FBR's are durable and not susceptible to damage from differential CTE's but to date, no one has been able to avoid significant contamination of the product with a metal walled FBR; 6) Difficulties maximizing bead size; 7) Keeping bead size within an acceptably small range or particle size distribution; 8) preventing deposition within the feed nozzles where a silicon containing gas is fed.

SUMMARY OF THE INVENTION

The present invention provides a process to solve some of the problems plaguing technology to accomplish the production of high purity silicon in a chemical vapor deposition (CVD) fluidized bed reactor (FBR). By introducing a draft tube near the center of an FBR, a circulation and heating pattern can be established within the FBR where solids are conveyed upward in the draft tube and flow downward in the annular zone surrounding the draft tube. Alternatively, the solids can be conveyed upward in the annular zone and flow down in the draft tube. In either flow path, the solids are heated by the outer wall of the reactor while flowing through the annular zone between the draft tube and the vessel wall.

In one embodiment, there is net upward flow of granules through the draft tube and net downward flow of granules through the annular space between the draft tube and the outside wall of the FBR. Granules are heated by the upper portion of the outside wall of the FBR. The descending granules react with silicon containing gas flowing up from the baseplate. The majority of deposition takes place in a lower annular portion of the FBR and the granules are heated in an upper section away from higher concentrations of reactive gas. With this configuration, the reactor wall in contact with the highest concentration of reactive gases can be cooler than the silicon beads and beads can be minimally fluidized in the annular zone to minimize void volume in the zone with the highest reactive gas concentration.

In an alternative embodiment, granular solids flow upward outside the draft tube and down through the draft tube. Gas fed into the bottom of the annular zone has a lower concentration of reactive gas than does gas fed into the draft tube. The granules are heated by the outside wall of the reaction chamber and the majority of deposition takes place inside the draft tube where the concentration of silicon containing gas is higher.

The vessel for this design can be made with several materials known to those skilled in the art. Preferably, the vertical sides and top of the reactor are made of carbon fiber/graphite composite (commonly referred as carbon/carbon composite, or simply CC), that is silicon carbide (SIC) coated. The bottom of the vessel and distributor are preferably made of monolithic graphite. By using these materials, problems of temperature limitations and contamination are substantially reduced versus using metallic components employed in some designs. The CC material is strong and can be fabricated in diameters up to at least 1 meter. If necessary, pieces can be joined end to end and sealed with a gasketted connection. When wall deposition of silicon occurs to an unacceptable extent to continue normal operation, the deposition can be melted off and drained to a safe location designed for this purpose.

The reactor of this invention constructed of graphite, CC and ceramic materials is enclosed in a metallic pressure vessel for secondary containment. This enables the reactor to be operated at pressures well above atmospheric pressure allowing greater gas mass flow rates at minimum fluidization velocities. By operating at elevated pressure and near minimum fluidization velocity, low void volumes can be achieved reducing dust formation when compared to beds with greater void volumes.

BRIEF DESCRIPTION OF THE SEVERAL VIEWS OF THE DRAWINGS

The objects and features of the invention can be better understood with reference to the drawings described below, and the claims. Drawings are not necessarily to any scale, emphasis instead generally being placed upon illustrating the principles of the invention. In the drawings, like numerals are used to indicate substantially similar features and streams throughout the various views and figures.

DETAILED DESCRIPTION OF THE INVENTION

Figure 1:
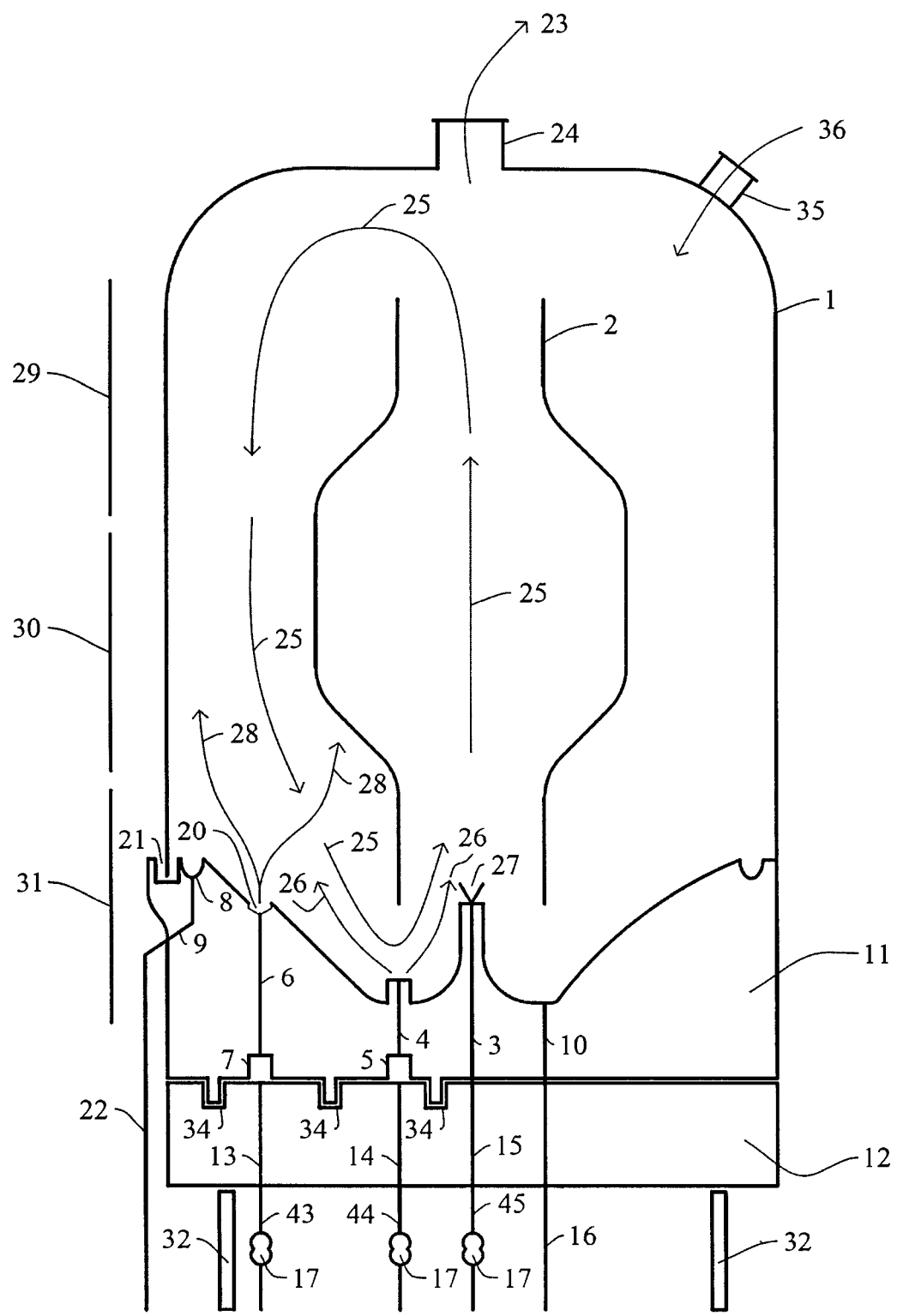
FIG. 1 is a schematic cross sectional view illustrating a preferred embodiment of a FBR for the CVD of silicon.

Air-Gap refers to substantially parallel or concentric surfaces with a space between them largely absent of any solid thermally conductive material. The space normally fills with whatever gas is in the adjacent environment.

Annular space refers to the space between the outer perimeter of the cross section of one closed geometric shape completely inside the cross section of the perimeter of another closed geometric shape. As used herein, an annular space is normally round, but this is not necessary. Annular zone refers to the axial extension of the annular space.

Baseplate refers to the bottom of a granular FBR, or the bottom head of the FBR. It could be flat, concave, convex, or have one or more inflection points in it.

Bed, in the context of a fluidized bed reactor, refers to the particulate media within the reactor that is fluidized when gas is flowing at sufficient velocity.

Bed Height refers to the length or top of the bed in a fluidized bed reactor.

CC refers to what is industrially known as carbon/carbon. It is carbon fiber/graphite composite material comprised of a woven carbon fiber cloth with the interstitial spaces substantially filled with graphite.

Countercurrent is understood to mean flows in substantially opposite directions such that a hot fluid might enter one end of a heat exchanger flowing one direction while a cold fluid enters the opposite end of the heat exchanger and flows directly opposite the direction of the hot fluid. It may also mean, for example, a gas flows in substantially one direction (typically upward) while a liquid or solid flows in substantially the opposite direction (typically downward).

Deposition refers to deposition of silicon from a silicon containing gas.

Dehydrogenation refers to heating granules to a high temperature in a non-deposition mode such that hydrogen and/or other gases within the particle are substantially driven out.

Draft tube refers to a geometric shape with a closed cross section within the perimeter of another geometric shape also having a closed cross section. The top and bottom of the draft tube are within the top and bottom of the outer geometric shape. A draft tube will normally be round and proximate to the center of the outer geometric shape, but neither roundness nor centricity are necessary.

FBR refers to a fluidized bed reactor. In a fluidized bed reactor in normal operation, particles are in motion relative to each other, said motion created by a gas rising through the solids. The bulk of fluidized solids have many liquid-like flow characteristics.

"Halosilane" is understood to be a compound of the general formula $R_nSiZ_{4-n}$, where the radicals R are identical or different and are each hydrogen or an organic radical, such as an alkyl group $C_nH_{2+1}$, and n is 0, 1, 2 or 3. Z is a halogen from the group Fluorine, Chlorine, Bromine, Iodine. When Z is chlorine (Cl), the halosilane is a chlorosilane. For example, in one embodiment the radicals R are —H, —$CH_3$, or a combination thereof. In certain embodiments, each R is —H. In certain embodiments, the integer n is 0, 1 or 2. In certain embodiments, n is 0. In preferred embodiments, the halosilane is tetrachlorosilane (silicon tetrachloride, STC). In other embodiments, the halosilane is a bromosilanes, chlorodisilane or methyltrichlorosilane. Anywhere a chlorosilane is referred to, other halosilanes are considered equivalent. i.e. bromosilanes, fluorosilanes, or iodosilanes.

Interchanger is understood to mean a heat exchanger exchanging thermal energy between two process streams. Any heat exchanger can be an interchanger if heat is transferred between two process streams.

Normal operation of a granular FBR means reactive gases are fed and chemical vapor deposition is taking place in at least part of the vessel.

Reactive gas refers to a silicon containing gas that will deposit silicon on granules and/or other surfaces.

Tangential means an entry into a closed geometric shape that will not pass through the proximate center of that shape. In a circular shape, a tangential line contacts a circle at one point only. As used herein, a tangential fluid entry will not necessarily be at the outer perimeter of that shape. For example, a tangential entry into the circular baseplate, can mean a flow path that is tangent to a circle smaller than the perimeter of the baseplate but the extension of that flow path does not pass through the proximate center of the baseplate.

Void Volume means the volumetric portion of a bed of granules that is non-solid material.

Throughout the description, where apparatus, compositions, mixtures, and composites are described as having, including, or comprising specific components, or where processes and methods are described as having, including, or comprising specific steps, it is contemplated that, additionally, there are compositions, mixtures, and composites of the present invention that consist essentially of, or consist of, the recited components, and that there are processes and methods of the present invention that consist essentially of, or consist of, the recited processing steps.

It should be understood that the order of steps or order for performing certain actions is immaterial so long as the invention remains operable. Moreover, two or more steps or actions may be conducted simultaneously.

It is contemplated that methods, systems, and processes of the claimed invention encompass scale-ups, variations, and adaptations developed using information from the embodiments described herein. Methods and processes described herein may be conducted in semi-continuous, and/or continuous operation. Modes of operation may alternate and be periodic. Reactors may be single-stage or multi-stage, and may be singular or plural without explicitly stating so. Where gas ports and inlets exist, they may be singular or plural without explicitly stating so. It is contemplated that methods of the invention may be implemented in completely new facilities or combined or supplemented with existing reactors, systems, or processes to make one or more halosilanes. Trichlorosilane (TCS), dichlorosilane (DCS), monochlorosilane (MCS) and/or silane being the most common of these processes at the time this is written. Methods of this invention may be combined with other CVD processes to make polysilicon and seed material for a CVD FBR by processes within or external to the FBR. The FBR of this invention may be combined with equipments and methods to classify and recycle particles of one or more size ranges or qualities while removing those of other size ranges or qualities.

The mention herein of any publication, for example, in the Background section, is not an admission that the publication serves as prior art with respect to any of the claims presented herein. The Background section is presented for purposes of clarity and is not meant as a description of prior art with respect to any claim.

The present invention is a fluidized bed reactor (FBR) of FIGS. 1-6 for the production of high purity granular silicon using one or more reactive silicon bearing halosilane gases and one or more non-reactive gases as gas feeds. Silicon particles can be charged and/or created within the FBR by methods of aforementioned references. After they have grown, silicon particles are removed from the FBR. Those particles may be dehydrogenated before or after being removed by heating them to a temperature higher than required for deposition—preferably under conditions where little or no reactive gas is present. Silane (SiH4) is the reactive species of primary interest, but the process can be adapted to other halosilanes.

Within the FBR exists a draft tube 2, normally cylindrical and at the center, but neither condition is necessary. The draft tube is affixed to the walls 1 with bracing 301 which consumes minimal cross sectional area between the draft tube and the vessel wall 1 as to leave the space between the draft tube and the vessel wall relatively unobstructed to vertical flow. The draft tube is positioned relative to the gas inlets in the baseplate 11 such that mixing between gas inlets from ports 6 in the annular zone and gas inlets from ports 3 at the center of the draft tube is minimized. A third set of gas inlets from ports 4 can be disposed between those proximate to the center of the draft tube and the annular zone to further minimize mixing between the gas introduced below the bottom of the draft tube and gas inlets in the annular zone.

In one embodiment, a substantially non-reactive gas can be introduced as a jet 27 within the perimeter of the draft tube in such a way as to create substantial upward conveyance of silicon beads. Beads can be conveyed vertically upward in a method similar to conventional dense phase or dilute phase conveyance within the draft tube by methods known to those skilled in the art. One skilled in the art will recognize that conveyed solids are moving in substantially the same direction as the motive gas as opposed to a fluidized bed where there is far more random motion of the solid phase and more recycling of the gas phase occurs. While some random motion of beads within the draft tube is expected, it is central to the design that the majority of gas and solid flow within the draft tube is co-current in this embodiment. With operating experience, the bulk flow rate of beads upward in the draft tube can be directly and predictably manipulated by changing the flow rate to feed port 3. Within the annular zone between the draft tube and the FBR wall, the beads will be minimally fluidized, meaning there will be movement of beads in all directions giving the beads many liquid-like flow characteristics. Gas injected from ports 4 located 4 radially near the perimeter of the draft tube keep beads fluidized all across the diameter of the baseplate and minimize mixing at gas inlets to the reaction chamber from ports 3 and 6. By minimally fluidizing the annular zone, and conveying through the draft tube, a net circulation pattern of granules moving down in the annular space between the draft tube and the FBR wall and net upward movement of granules within the draft tube is achieved. During normal operation, heat from electrical resistance heaters 29 and/or 30, microwave heaters, induction heating, or other techniques known to those skilled in the art are used to heat the FBR wall and/or beads near the top of the bed and near the outer diameter of the bed. Where resistance heaters are used, they are placed inside vessel 218. Those heated beads will then flow down in the annular space of the FBR between the draft tube and vessel wall. Downward flowing fluidized beads will react with silicon containing gas rising from the annular portion of the baseplate. The depth of granules in the bed coupled with bead temperature and circulation rate of the beads is established such that substantially all of the reactive silicon containing gas will have reacted and deposited on the beads descending within the annular region before the gas reaches the externally heated wall at the upper portion of the FBR. Flow line 25 shows the general circulation of granules within the bed.

In another embodiment, a substantially non-reactive gas can be introduced as one or more jets within the annular zone in such a way as to create substantial upward conveyance of silicon beads in the annular zone. The rising beads are heated by the wall of the vessel and/or other aforementioned methods. In this embodiment, the entire length of the FBR wall below the level filled with granules may be heated with heaters 29, 30, and 31. By providing minimal fluidization within the draft tube and by feeding a gas having a higher reactive silicon compound concentration than the annular zone, the majority of deposition occurs on the beads descending within the draft tube. Gas inlets from ports 4 between gas inlets from ports 6 in the annular zone and gas inlets from ports 3 proximate to the center of the draft tube serves the same purpose as the embodiment with the opposite net granular flow directions. In this embodiment, the general flow path of granules is opposite that shown for flow line 25.

By making the reactor parts exposed to process gases of SIC coated CC material, the walls of the FBR can be heated sufficiently hot to heat beads to temperatures above 750° C. for deposition. Beads can also be heated above 1000° C. for dehydrogenation. CC and graphite materials can be heated above 1420° C., the melting point of silicon.

With all other factors affecting dust formation being equal, the less densely packed are the granules, the more homogeneous nucleation will occur. Homogeneous nucleation leads to undesirable raw material loss from dust formation and added complexities dealing with very fine particulates in the exhaust gas stream 23. Similarly, the lower the concentration of reactive silicon compounds in the fluidization gas, the less homogeneous nucleation will occur—assuming all other things are equal. Granules in zones with greater gas velocity (i.e. the part of the reactor with net upward movement of granules) will have greater void volume than a minimally fluidized zone, hence the use of gas having lower reactive component concentration to convey beads upward than in the down-flowing zone. Bulk flow of solids downward through the reactive zone provides opportunities to introduce movement between particles beyond that caused by fluidization by, for instance, varying the cross sectional area of the draft tube. It is necessary to have sufficient movement between particles in the reactive portion of the FBR to prevent cementing particles together. An intermediate zone of gas inlets from ports 4 disposed radially between the other two and radially near the perimeter of the draft tube will flow into both the draft tube 2 and the annular zone and reduce mixing between the gases introduced at the feed locations of ports 6 and 3. By making the gas from inlets of ports 4 non-reactive, greater control is exercised over the relative concentration of reactive silicon containing compounds in the draft tube and the annular zone outside the draft tube.

In one embodiment, gas inlets from ports 4, radially near the perimeter of the draft tube, and/or gas inlets from ports 6 in the annular space may introduce gas flow in a tangential, or tangential and upward direction encouraging smaller particles to move to the draft tube while larger particles will move away from the draft tube. Tangential upward entry is shown schematically as a top view in FIG. 6A and as a sectional side view in FIG. 6B. In a FBR with a draft tube diameter larger than approximately 150 mm, gas inlets from ports 3 may also use tangential entry and be displaced away from the proximate center of the draft tube.

In an alternate embodiment, gas from flares 20 on ports 6 may be angled substantially upward (without tangential entry) and inclined toward the center in order to direct the initial jet of reactive gas away from the outer wall, or toward the outer wall to direct the initial jet of reactive gas away from the draft tube.

Gas feed temperature for non-reactive gases can be maximized consistent with materials of construction limitations of the feed piping used to direct it. As a practical matter, this can be up to about 600-700° C. with metallic piping. A hot draft tube wall becomes undesirable at the point silicon deposition occurs on it to a significant extent. For the operating mode with net upward granular flow in the draft tube and a non-reactive gas feed in port 3, temperature inside the draft tube could be hotter than the beads descending in the annular zone. To reduce heat transfer through the draft tube wall, the draft tube can be constructed with an air-gap between the inside diameter and outside diameter, thus minimizing the surface temperature exposed to the higher concentration of reactive gas outside the perimeter of the draft tube and minimizing deposition.

In an alternative embodiment, gas feed temperature into the draft tube can be colder than the beads in the annular zone and the wall of the draft tube made to maximize heat transfer by making it thin and solid. This design keeps the outside wall cooler and minimizes silicon deposition on the outside wall.

A recirculation loop drawing gas stream 23 from the reactor exhaust port 24 and pipe 33, providing motive force, and discharging it into the bottom of the reactor through pipes 43, 44, and 45 will be employed. Interchangers may be employed to optimize energy consumption of the process. Motive force for the recirculated gas flows can be provided by, for example, a compressor or ejector. Heat integration schemes known to those skilled in the art are used in the recirculation loop. Substantially all gases come out of the top of the FBR together. Unreacted gases may be separated, re-combined at the desired concentration, and mixed with make-up feeds by methods known to those skilled in the art.

During deposition, hydrogen and other gases become trapped within the beads. Beads can be dehydrogenated by flowing non-reactive gas through the bed while heating the beads to temperatures sufficiently high to accomplish the dehydrogenation, or approximately 1000-1100° C. This can be done in a semi-batch operation where the process alternates between periods of deposition and dehydrogenation or by vessels in series operation as described in U.S. Patent Application Publication 2006/0105105 A1. Dehydrogenation can be conducted with granular up-flow or down-flow in the draft tube. When both deposition and dehydrogenation are conducted in the same vessel, dehydrogenation is conducted after deposition and prior to discharge of a portion of beads contained within the reactor.

In a preferred embodiment, the FBR is enclosed within secondary containment 218 (such as a metallic pressure vessel) such that it can be operated safely at significantly elevated pressures increasing the throughput of the FBR. The secondary containment vessel will preferably have internal insulation 215 between resistance heaters 29, 30, 31 vessel 218. Vessel 218 can be jacketed or otherwise equipped for circulation of a heat transfer fluid around the pressure membrane to ensure the metallic vessel does not exceed its temperature rating. As a practical matter, a containment vessel is a necessity even at atmospheric pressure due to the hazardous nature of the gases used and to protect the heated surfaces from atmospheric gases. By enclosing the FBR inside a containment vessel, and not heating through the wall of the containment vessel, deposition is accomplished at increased pressure with minimal problems containing the pressure. By operating at increased pressure, mass flow of reactive gas can be increased at a given ratio of U/Umf where Umf is the minimum fluidization velocity and U (Lord et al. U.S. Pat. No. 5,810,934) is the space velocity of the fluidization gas. With increased fluidization gas flow, deposition rates increase, and capacity for a reactor of given size increases. Overall the process cost is lower at higher pressure.

In the case having net upwards granular flow in the draft tube, the diameter of the draft tube must be sufficiently large to establish an internal solids recirculation rate to convey sufficient quantities of beads to accomplish overall objectives of the FBR, but not so large as to make it difficult to prevent significant quantities of reactive gases from entering the draft tube at the bottom. Trade-offs can be made between draft tube diameter and bulk velocity within it. The cross sectional area of the draft tube for upward non-reactive flow through the draft tube can be well under 25% of the cross sectional area of the reaction chamber. The diameter of the draft tube and the radial gap in the annular zone needs to be at least the diameter of 30 silicon beads of average size. The cross sectional area of the annular zone must generally be sufficiently large to enable the desired reactive gas flow at between one and two times the minimum fluidization velocity. As would be apparent to one skilled in the art, silicon beads can be circulated within the reactor a plurality of times to obtain optimum deposition before their removal from the reactor.

In the case having net upward flow of granular material in the annular zone, the diameter of the draft tube must be at least the diameter of 30 silicon beads of average size and sufficiently large to enable the desired reactive gas flow at between one and two times the minimization fluidization velocity. The annular zone must have a radial dimension of at least approximately 30 silicon beads of average size and have sufficient cross sectional area to convey the desired flow of granules while not requiring gas flows resulting in excessive costs to circulate, heat, and cool the fluidization gas.

It is necessary to have sufficient movement between beads to prevent deposition joining the particles in large masses, or in the extreme case into a one solid chunk. This movement is attained by both bed fluidization and circulation of the granules. Bead movements relative to each other from circulation while flowing through a varying cross section is movement associated with minimal voids. Where fluidization is concerned, voids increase in size as U/Umf increases. Larger void volume where reactive gas is present results in greater amounts of dust formation. Thus the best solution is to operate relatively close to Umf and introduce agitation through circulation and changes in flow area as well as fluidization.

The diameter of the draft tube and/or the FBR can be varied along its length to control the velocity profile within the FBR. For example, the draft tube can be made larger diameter to increase the velocity in the annular space, or vice versa. The FBR can be made larger or smaller in diameter in a design having a draft tube of constant cross section, accomplishing the same thing. For example, a smaller cross sectional area within a flow zone near the baseplate will increase the velocity near the baseplate. Both draft tube and FBR perimeter can be varied multiple times along the length to obtain additional mixing among the beads.

Figure 2:
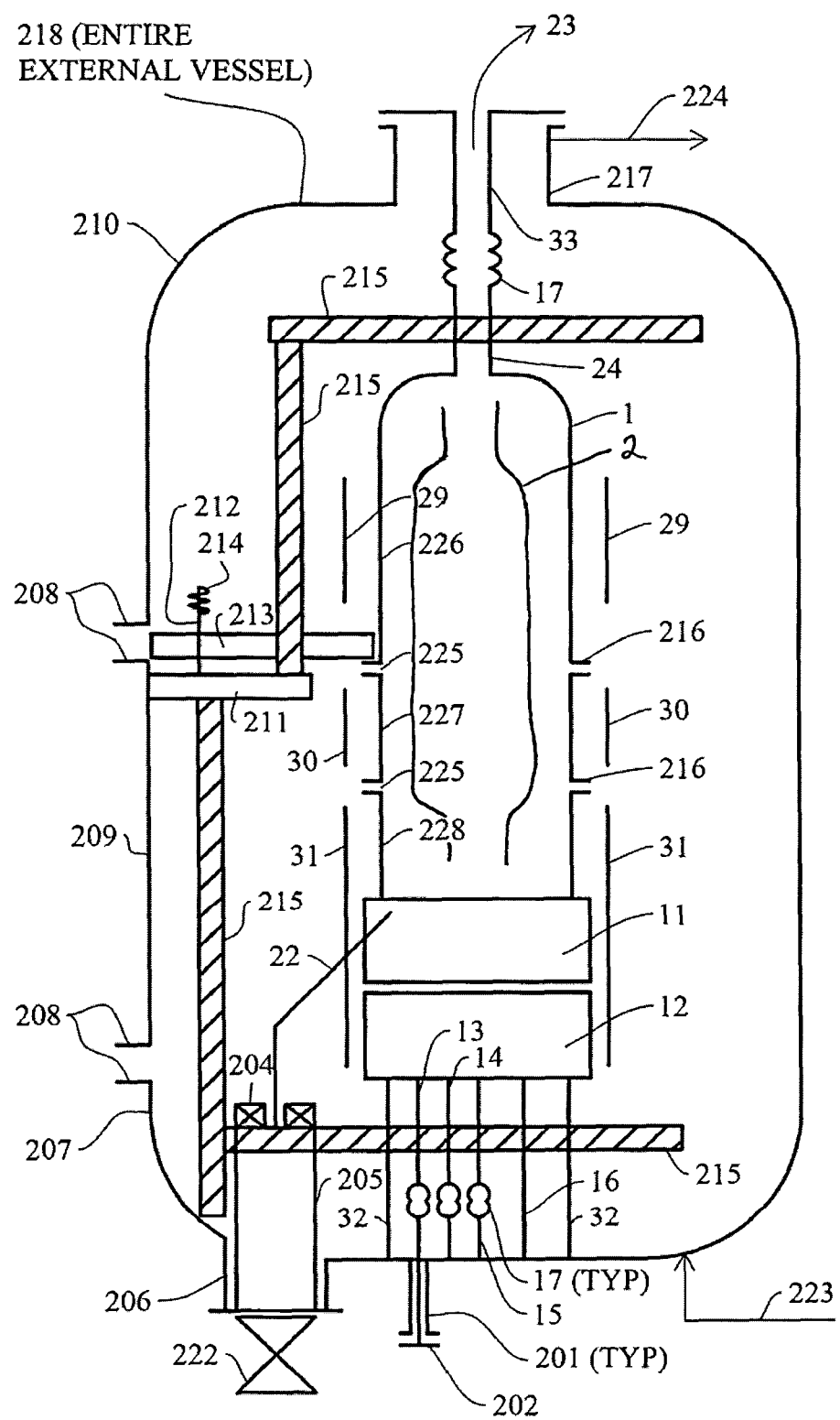
FIG. 2 is a schematic cross sectional view illustrating a preferred embodiment of the FBR inside a pressure vessel for secondary containment.

FIG. 1 shows the CVD FBR of this invention to make granular silicon. The perimeter of the FBR is defined by a nominally cylindrical shell 1 with a baseplate 11 at the bottom. Beneath the baseplate is a manifold plate 12. As further described herein, the manifold and baseplate may be symmetric about a centerline, but are not necessarily so. Some details in figures are shown on only one side of the device for clarity. The manifold plate provides a path to direct flow from feed pipes 43, 44, and 45 through channels 13, 14, and 15 and finally into inlet ports 3, 4, and 6. Annular channel 7 connects feed channel 13 to one or more feed ports 6. Nozzle 201 and plate flange 202 is shown only on feed channel 13 but should be understood to represent a typical arrangement for other conduits penetrating vessel 218 and connecting to internals components inside 218. 201 and 202 are accomplished using techniques and devices familiar to those skilled in the art (FIG. 2). Nozzle 217 is of substantially the same design as nozzle 201 (FIG. 2). Annular channel 5 connects feed channel 14 to one or more feed ports 4 and associated gas inlets. Adjacent annular channels 5 and 7 are isolated from each other, preferably with gasketted surfaces 34 in a tongue and groove joint as shown. Feed inlets to the reaction chamber from port 3 can represent one or more points of introduction into the draft tube. Flow path 28 represents the general direction of gas from ports 6. Flow path 26 shows a bifurcated flow path flowing into both the draft tube and the annular zone for gas from inlets of port 4. Jet 27 shows the dominant flow pattern of gas inlet from port 3. Substantially all of this gas ultimately flows up through the draft tube. By having independent control of gas flow through ports 4 and 3, the bulk flow rate of beads up through the draft tube can be adjusted over a range of flow rates while minimizing the flow of gas from port 6 into the draft tube. At lower flow rates in port 3, flow to port 4 can be increased and vice versa to accomplish this.

Reactive and/or non reactive gases are introduced into the manifold plate through feed lines 43, 44, and 45 and proceed through the flow paths previously described. Gas compositions are in accordance with the embodiments previously described for net upward and downward flow of granules through the draft tube. Lines 9 and 10 are for removal of silicon beads in normal operation or following a dehydrogenation step, and liquid silicon when wall depositions are melted out. A draft tube 2 is located within the perimeter of the shell 1 and is supported from the wall by brackets 301 (shown in FIG. 3). Normally, the draft tube is placed at the center of the shell, and both the shell and draft tube are round, but it is not essential the shell or draft tube be round, nor that the draft tube be at the center of the shell.

In operation, the shell is filled with silicon beads to a level at or below the top of the draft tube. This is known as the bed height. Beads flowing upward can be dense phase or dilute phase conveyance, but preferably dense phase to minimize gas flow through the draft tube to minimize the size and costs of peripherals necessary to re-circulate the gas used as a motive fluid. Dense phase conveyance also results in less dust formation in the event some reactive gas is present due to reduced void volume in the portion of the bed moving upward.

During deposition operations with net upward flow of granules in the draft tube, the beads are heated primarily in the upper portion of the bed by heater 29. The top of heater 29 is roughly even with the top of the bed. One skilled in the art will recognize the top of the draft tube may be above the bed height without altering the general design up to the point that pressure drop through a longer draft tube creates undesirable pressure drop and mixing of gas fed through ports 3 with gas from ports 6. Since the void fraction in the draft tube in this mode is higher than in the annular zone, bulk density and hence pressure drop per unit length in the draft tube will be lower during normal operation. In this way, the vertical portion of the shell 1 below the heater 29 is cooler than the beads helping to minimize deposition on the lower wall where reactive gas concentration is greatest. The lower wall can be further cooled by increasing radiative, conductive, and/or convective cooling, but doing so more than necessary is undesirable as more energy is ultimately required to keep the beads inside hot. Heaters 30 and 31 are used primarily for startup and to melt silicon deposited on reactor surfaces out of the reactor. If the bed level is lowered, the FBR could be operated with heater 29 inoperable and heater 30 providing heat.

During deposition operations with net downward flow in the draft tube, the entire length of the FBR wall below the level of granules can be heated so all heaters 29, 30, and 31 can be used. Heater 31 and other parameters such as feed gas temperature entering pipes 43, 44, and 45 are controlled to keep baseplate temperatures low enough to prevent deposition within the baseplate.

The diameter of the draft tube may change along its axial dimension in order to establish a desirable velocity profile. If Silane is the reactive gas, the net reaction of:

$$SiH_4 \rightarrow Si + 2H_2$$

creates two moles of gas product for every mole of silane fed. The volumetric flow of gas will increase as deposition occurs and as the gas heats up. Both occur as the gas rises in the annular portion of the FBR. Thus, diameter of both the draft tube and FBR shell must increase along the axial length to achieve constant velocity. Some classification of particles is possible within the fluidized bed by establishing a higher gas velocity at the bottom. Higher velocity at the bottom will tend to concentrate larger diameter particles at the bottom. To the extent it does not increase dust formation, doing so is desirable as a large particle is more desirable to some end users.

In normal operation, some silicon will be deposited on the internal surfaces of the FBR assembly. This deposition is desirable to the extent it minimizes contamination of silicon beads from the reactor materials of construction and undesirable to the extent it reduces the cross sectional area within the reactor. By making the assembly out of graphite or CC material, silicon depositions can be melted out after emptying the bed of silicon beads. A gutter 8 is formed in the baseplate as close to the shell as practicable. This gutter is an annular channel within the baseplate that will drain liquid silicon that is melted off of the shell wall using heaters 29 30, and 31. Liquid running into the gutter is drained away through a channel 9 within the baseplate and finally to channel 22 made of a piece of high temperature piping and to a safe receptacle vessel 402. Drain line 10 serves a similar purpose for silicon that may be melted off of the draft tube or baseplate and any molten silicon that bypasses the gutter 8. Product could be melted out with either CC or graphite construction. CC is preferred because it is much stronger and can be fabricated in much larger cylindrical pieces. In the event the reactor is cooled with silicon deposited on internal parts, CC is far more resistant to breaking from differential coefficients of thermal expansion Vs silicon than is graphite.

The baseplate 11 of the FBR is normally formed of graphite and/or CC material, but could also be made of ceramic materials such as silicon carbide, silicon nitride, or alumina. In order to deal with the high temperatures necessary during operations to melt out silicon metal, flow channels 10 and 22 can be made of pipes made of graphite, CC, or a suitable ceramic. Of these, CC is the most robust. At a distance sufficiently far away from the manifold plate 12 that temperatures are low enough, metallic bellows connections 17 or similar can be installed in the feed line 15 installed in pipes 33, 43, 44 and 45 to deal with differential expansion of the various parts. The manifold plate can rest on support ring 32 made of CC or graphite material that will ultimately rest on a metallic containment vessel. The support ring 32 must be long enough such that the lower end resting on the containment vessel does not exceed the temperature rating of the containment vessel when the end touching the manifold plate 12 is at its maximum temperature of approximately 1420° C.

Product gases and unreacted feed gases exit the FBR as stream 23 through nozzle 24 at the top of the FBR. A piping arrangement analogous to parts 45 and 17 can be used for gas stream 23. A feed port 35 is provided for silicon seed granules 36. Feed port 35 could also be used to introduce fluid to cool the gas above the bed height.

FIG. 2 shows a pressure vessel 218 made of a top head 210, a bottom head 207, and one or more straight sections 209. The sections are joined together using standard pressure vessel flanges 208 or similar closures known to those skilled in the industry. Trade-offs understood by those skilled in the art can be made between insulation thickness and insulation quality, temperature rating of the vessel, and whether a jacket with cooling media is used vs. ambient air cooling.

FIG. 2 shows a multi-piece FBR 226, 227, 228 (collectively, the shell, 1) with flanges or other type of connection 225 and 216 at the joints. Preferably, the seal in joint 225 is a tongue and groove joint with a graphoil gasket. A means is needed to hold the FBR together in a relatively gas tight seal. This is provided by compression ring 213 which is held in place by studs 212 mounted in a stud ring 211 and springs 214, thus allowing for differential expansion of parts while retaining adequate compressive forces to keep joints in the FBR sufficiently leak free to maximize lifespan of components inside the containment vessel and outside the FBR. A purge gas supply 223 and vent 224 may be introduced into the space between the FBR and the containment vessel to control the gas composition present in said space.

Vessel nozzle 206 is provided to remove silicon beads and or liquid silicon coming from drain line 22. A nozzle liner 205 made of graphite, CC or a ceramic material is placed inside nozzle 206 and packing 204 is provided to seal drain line 22 against liner 205 and nozzle 206. Nozzle 206 may be as long as necessary to provide an acceptable temperature at the inlet of valve 222. The diameter of liner 205 is smaller than the bore of valve 222 such that flowing molten silicon will not touch the valve 222 when it is open. A purge stream 401 can be used to cool the beads prior to discharge and to fluidize the beads to prevent agglomeration. A similar arrangement (not separately shown) is used for drain line 16 which serves a similar function to line 22.

Figure 3A:
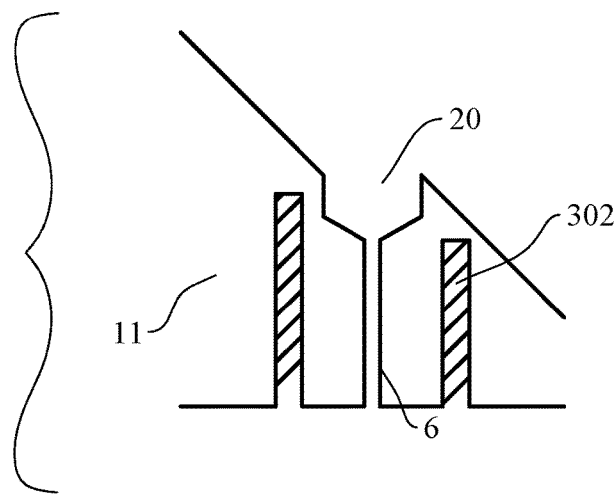
FIG. 3A is a schematic partial side cross sectional view of the bottom plate shown in FIG. 3B.
Figure 3B:
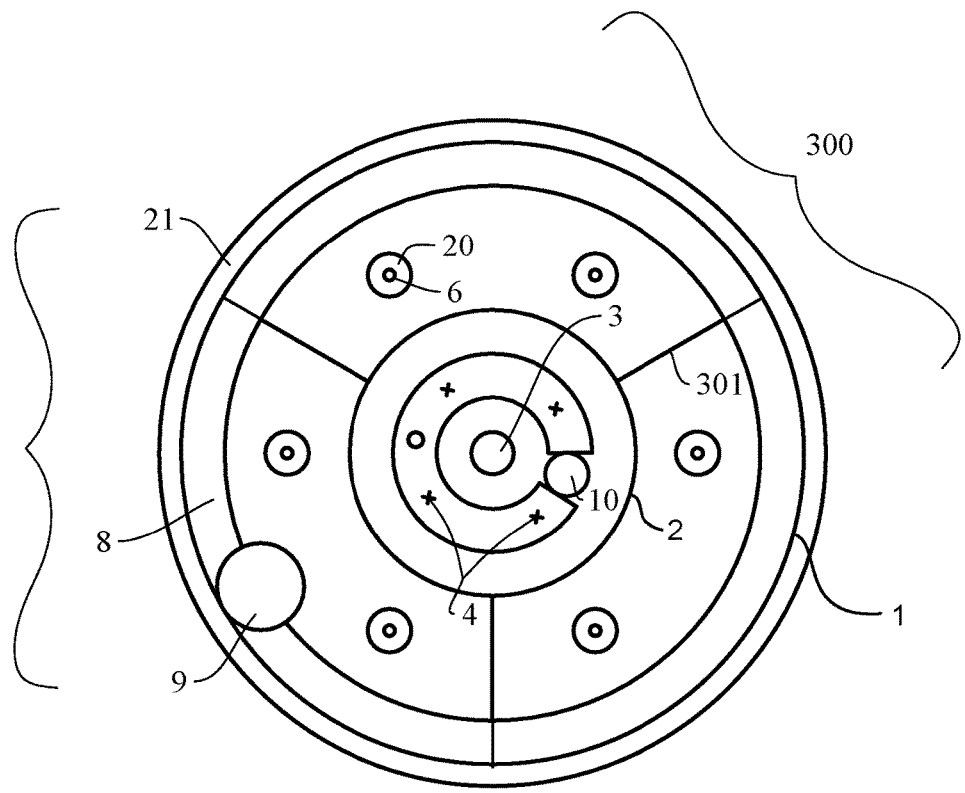
FIG. 3B is a schematic top view of a preferred embodiment of the bottom plate of the FBR of FIG. 1.

FIG. 3 is a schematic top view of the baseplate of the FBR more clearly showing the arrangement of the gutter 8 and withdrawal port 9 near the outer perimeter of the baseplate. It shows the relative location of one or more gas inlet flares 20 and fluidizing gas inlets from ports 3, 4, and 6. A feed gas flare 20 may also be used on feed inlets from ports 3 and 4. Low point drain 10 is also shown at a recess from the raised annular ring containing gas inlets from ports 4. FIG. 3A shows an "air-gap" 302 in a breakout sectional detail of one feed gas inlet flare 20 and feed port 6. The air-gap is fabricated into the baseplate coming up from the bottom around the reactive gas inlets to insulate the feed ports 6 from a portion of the heat transfer that would otherwise occur through the baseplate and reduce the likelihood of deposition in the feed port 6.

Figure 6A:
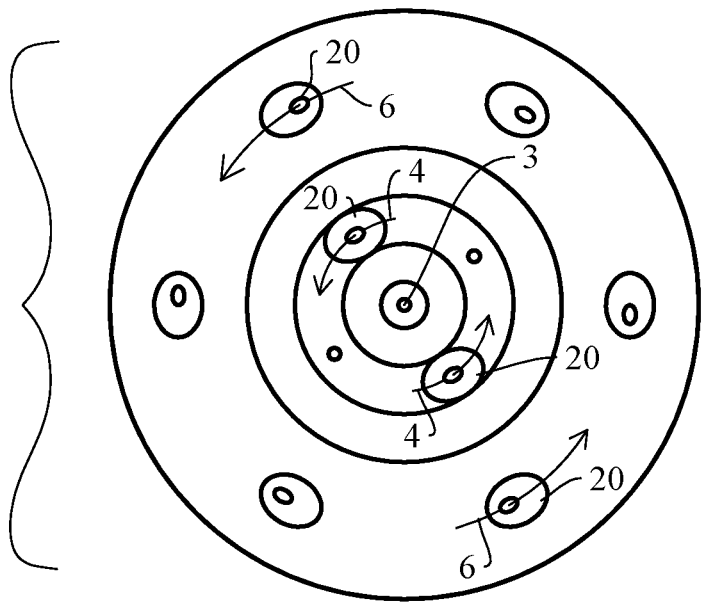
FIG. 6A is a schematic top view of the baseplate showing a preferred orientation of the feed inlets and feed inlet flares.
Figure 6B:
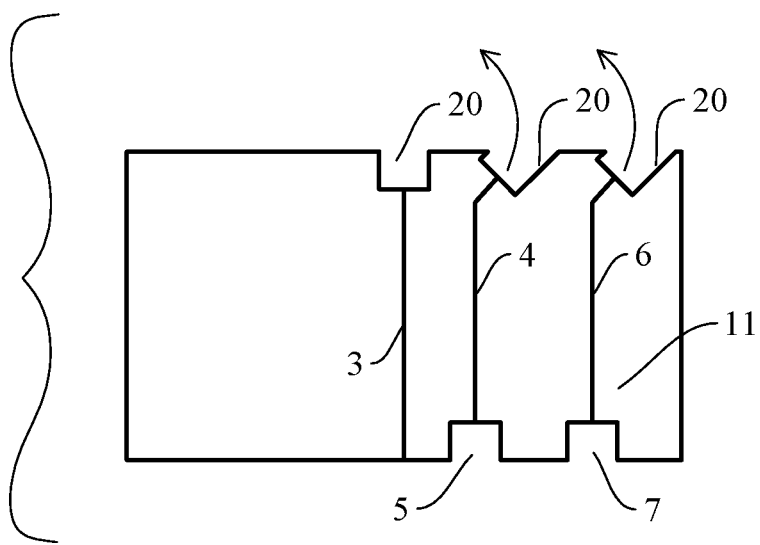
FIG. 6B is a schematic partial cross sectional side view of the baseplate shown in FIG. 6A.

FIGS. 6A and B show partial schematic views of the baseplate 11 and tangential feed for gas inlets from ports 4 and 6. It also shows flare 20 around the feed inlet.

Figure 5:
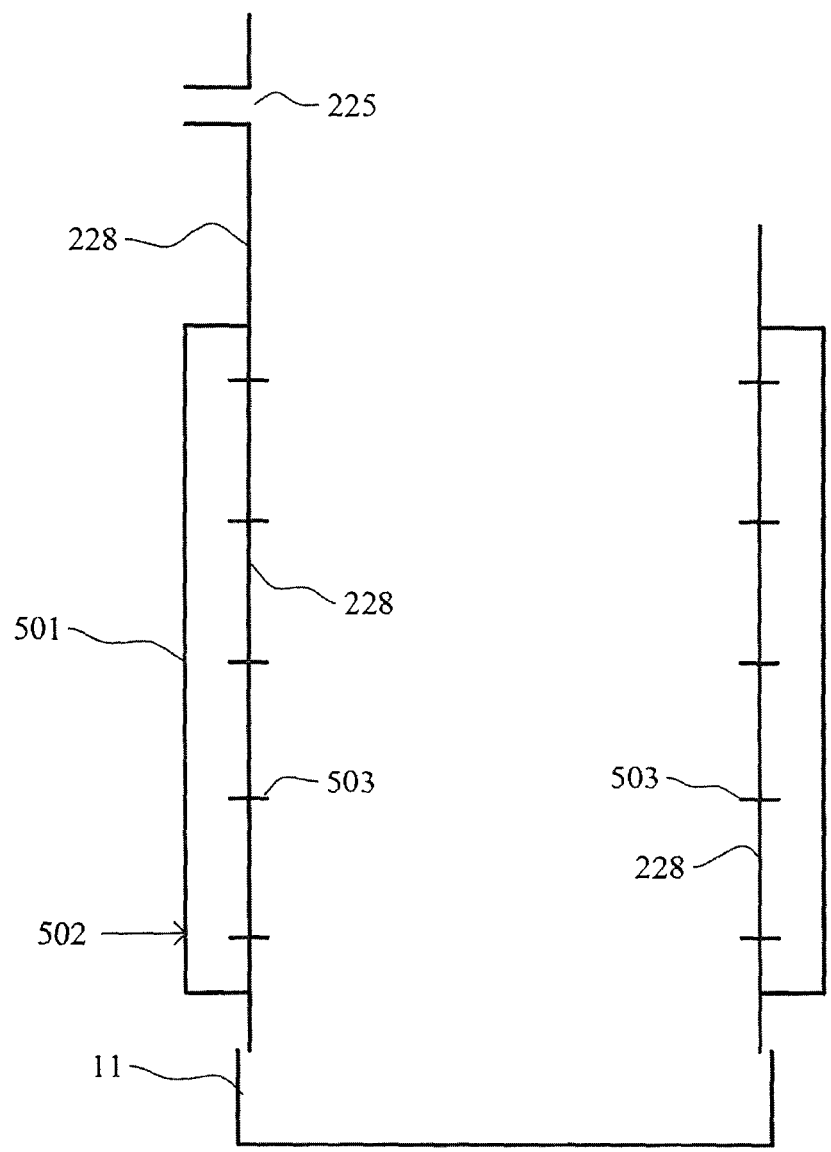
FIG. 5 is a schematic cross sectional view of a preferred embodiment of a jacket on the FBR allowing for gas injection through the walls of the FBR.

FIG. 5 shows a jacket 501 around lower FBR section 228. The jacket enables a non-reactive gas to be introduced into the jacket through feed pipe 502 and then into the FBR through one or more injection ports 503. A gas thus introduced can modify fluidization characteristics and/or reduce silicon deposition on the wall.

Figure 4:
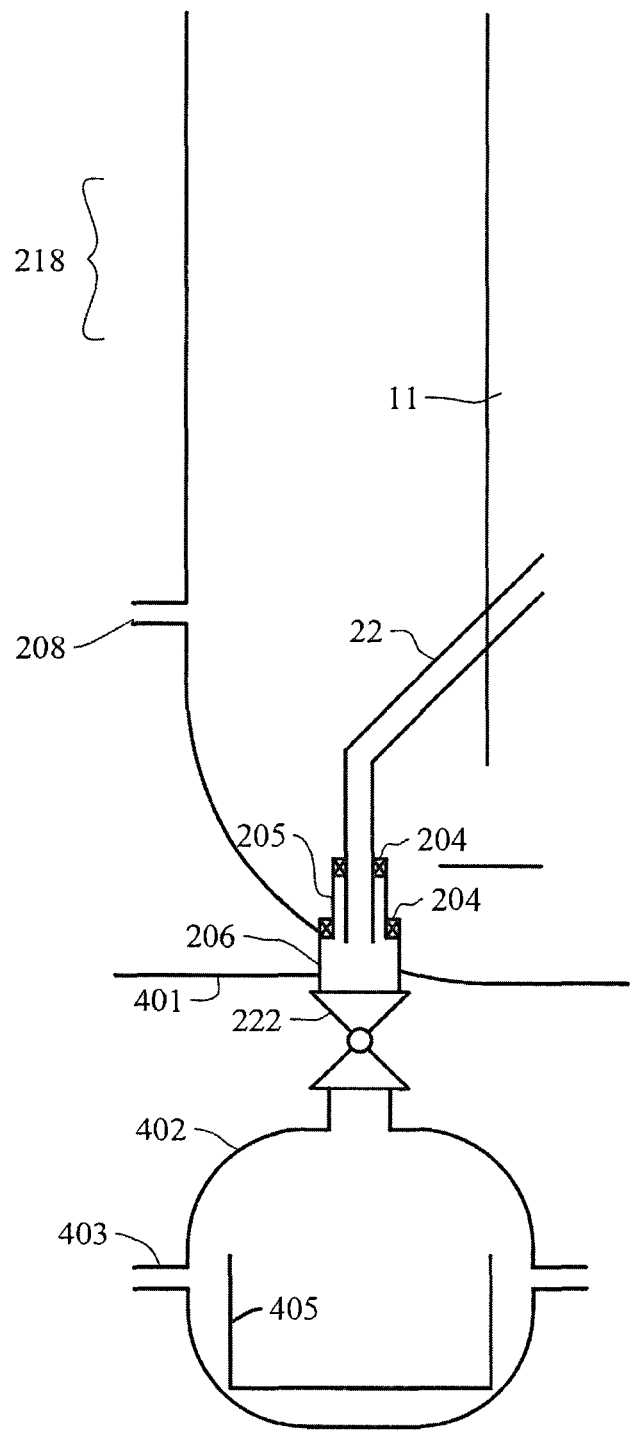
FIG. 4 is a schematic cross sectional view illustrating a preferred embodiment of a port for removal of silicon beads and liquid silicon and a receiving vessel for materials discharged.

FIG. 4 shows a vessel 402 for receiving granular or molten silicon from ports connected to lines 16 or 22.

Designs and details known to those skilled in the art can be used to fabricate such a vessel capable of being fluidly connected to the FBR and subsequently disconnected and opened. A removable liner 405 compatible with the materials handled is installed within vessel 402. A flange 403 is provided to access the inside of vessel 402.

Constructive Example 1

The draft tube FBR was modeled using chemical engineering simulation software widely used in industry (Chemcad, Version 6, provided by Chemstations, 3100 Wilcrest Drive, Suite 300, Houston, Tex., USA and Aspenplus, Version 8, provided by AspenTech, 20 Crosby Drive, Bedford, Mass., USA). Physical properties, thermodynamic models, and equations of state known by those skilled in the art to be sufficiently accurate for industrial applications were used. Feed gas through ports 6 was modeled at 15 mol % SiH4, balance H2 at a mass flow of 659 kg/hr at 165° C. Feed gas through port(s) 3 was modeled at 12 kg/hr H2 at 600° C. Pressure was 5 bar. Net flow upward through the draft tube was 18831 kg/hr at a volumetric rate of 1.03 ft3/S at 706° C. 293 kg/hr exited the RXR in stream 23 as 1.2 mol % SiH4, balance H2, at 793° C. The silicon rising through the draft tube (18819 kg/hr at 706° C.) descended in the annular space and 582 kW heat was added from heaters 29, 30 raising the temperature to 800° C. at the bottom of the annular space. 378 kg/hr of Silicon was discharged from the FBR through flow channel 9 at 797° C. 214 kg/hr of the H2 exiting the reactor in stream 23 is recycled and the balance is exhausted. This recycle stream is accounted for above as part of the feed stream to ports 6. The balance of the feed to ports 6 is make-up SiH4 at 30° C.

Constructive example 2: The process of example 1 was modeled again with the following changes: Zero feed to ports 3; 24 kg/hr H2 at 600° C. to ports 4 (with half of the flow from ports 4 flowing up through the draft tube and half of it flowing through the annular space); 12 kg/hr less H2 was fed to port 6. Port 6 feed temperature was 158° C. Heat input from heaters 29, 30 was 561 kW. There was no material difference to other streams Vs constructive example 1.

It is understood that the foregoing examples are merely illustrative of the present invention. Certain modifications of the articles and/or methods employed may be made and still achieve the objectives of the invention. Such modifications are contemplated as within the scope of the claimed invention.

The invention claimed is:

1. A heated fluidized bed chemical vapor deposition reactor for production of granular silicon comprising:
   a. a top, a bottom, and walls, an inner diameter of the walls defining a reaction chamber, the reaction chamber containing a fluidized bed, at least a portion of the walls of the reaction chamber heated above 1420° C. are made of carbon fiber and graphite composite configured of woven carbon fiber with greater than 66% of the voids in the interstitial spaces between carbon fibers filled with graphite;
   b. a hollow draft tube suspended within the reaction chamber of the chemical vapor deposition reactor, a top end of the draft tube disposed below the top of the reaction, chamber, a bottom end of the draft tube disposed above the bottom of the reaction chamber, the draft tube suspended in the chamber providing for a direction of flow within the fluidized bed;
   c. a first set of feed gas ports feeding a silicon containing gas into an annular space between the walls of the reaction chamber and the hollow draft tube;
   d. a second set of feed gas ports feeding a non-reactive gas into the hollow draft tube acting as a motive fluid to transport beads upward through the draft tube;
   e. a third set of gas feed ports feeding substantially the same non-reactive gas as the second set of gas feed ports and positioned radially between the first set of gas feed ports and the second set of gas feed ports and below the bottom of the draft tube whereby gas flow from the third set of feed ports serves to at least reduce mixing between gases flowing from the first set of gas feed ports and the second set of feed ports; and
   f. a heater for heating the reaction chamber to maintain conditions so chemical vapor deposition occurs on silicon beads in said annular space between the walls of the reaction chamber and the hollow draft tube; wherein at least one of said first set of feed gas ports, said second set of feed gas ports, and said third set of feed gas ports has a gas feed rate to accomplish a gas velocity to maintain fluidized bed conditions in the annular zone; and wherein the net flow of solids down through said annular space is controlled by manipulating the gas flow rate up through the draft tube.

2. The reactor of claim 1, wherein said reaction chamber further comprises a baseplate having an axial low spot around a center of the baseplate.

3. The reactor of claim 2, wherein said baseplate further comprises a gutter and a drain line from the gutter, said gutter configured to collect and remove liquid melted off of at least part of the walls and baseplate of the reaction chamber.

4. The reactor of claim 1, wherein said second set of gas feed ports feeding a non-reactive gas into said hollow draft tube is disposed at or below said first set of gas ports feeding silicon containing gas into said annular space.

5. The reactor of claim 1, further comprising a heating element proximate said walls near a top of said fluidized bed of said reaction chamber.

6. The reactor of claim 1, wherein said first set of gas ports feeds said gas into said annular space tangentially.

7. The reactor of claim 1, wherein a diameter of said hollow draft tube is not consistent between said top end and said bottom end.

8. The reactor of claim 1, wherein a diameter of said reaction chamber—is not consistent between said top and said bottom.

9. The reactor of claim 1, wherein said second set of gas feed ports are disposed in a center of said bottom of said reaction chamber in an axial low spot relative to said first set of gas feed ports and said third set of gas feed ports.

10. The reactor of claim 1, wherein said reaction chamber further comprises a graphite baseplate.

11. The reactor of claim 10, wherein said baseplate further comprises a gutter and a drain line from the gutter, said gutter and drain line configured to collect and remove silicon and other material melted from within the reaction chamber.

12. The reactor of claim 1, further comprising an external containment vessel into which the reaction chamber is disposed.

13. The reactor of claim 12, said reaction chamber further comprising a baseplate, the baseplate connected to said walls of said reaction chamber by a spring loaded compression ring assembly, wherein the compression ring assembly is braced between said reaction chamber and said containment vessel.

14. The reactor of claim 1, wherein a cross-sectional area of said hollow draft tube varies between said top end of said draft tube and said bottom end of said draft tube.

\* \* \* \* \*